United States Patent [19]

Maio et al.

[11] Patent Number: 4,937,579
[45] Date of Patent: Jun. 26, 1990

[54] METHOD OF CONVERTING ANALOG SIGNALS INTO DIGITAL SIGNALS AND SYSTEM FOR CARRYING OUT THE METHOD

[75] Inventors: Kenji Maio, Tokyo; Masao Hotta, Hannou; Shigeru Watanabe, Tachikawa, all of Japan

[73] Assignees: Hitachi Electronics, Ltd.; Hitachi, Ltd., both of Tokyo, Japan

[21] Appl. No.: 271,652

[22] Filed: Nov. 16, 1988

[30] Foreign Application Priority Data

Nov. 17, 1987 [JP] Japan ................... 62-290319

[51] Int. Cl.$^5$ ............................................. H03M 1/18
[52] U.S. Cl. ................................... 341/165; 341/155; 341/156; 341/139
[58] Field of Search ............... 341/131, 139, 155, 156, 341/161, 162, 185; 364/135, 180, 182

[56] References Cited

U.S. PATENT DOCUMENTS

| | | | |
|---|---|---|---|
| 3,909,597 | 9/1975 | Dunn et al. | 341/135 |
| 4,345,241 | 8/1982 | Takeuchi et al. | 341/155 |
| 4,398,179 | 8/1983 | Kaneko | 341/131 |
| 4,456,904 | 6/1984 | van de Grift | 341/156 |
| 4,654,634 | 3/1987 | Thong et al. | 341/155 |

Primary Examiner—William Shoop, Jr.
Assistant Examiner—Gary J. Romano
Attorney, Agent, or Firm—Antonelli, Terry, Stout & Kraus

[57] ABSTRACT

The same analog signal is inputted to an 8-bit AD converter and to a 4-bit AD converter to obtain an 8-bit digital data and a 4-bit digital data for the same sample value of the analog signal. Values of the 8-bit digital data and 4-bit digital data are compared with each other. The 8-bit digital data is outputted as a digital signal for the sample value of the analog signal when a difference between these values is not greater than one-half the quantity that corresponds to the least significant bit of the 4-bit digital data, and the 4-bit digital data is outputted as a digital signal for the sample value of the analog signal in other cases. There is realized AD conversion which operates apparently at high speeds maintaining high accuracy.

14 Claims, 3 Drawing Sheets

METHOD OF CONVERTING ANALOG SIGNALS INTO DIGITAL SIGNALS AND SYSTEM FOR CARRYING OUT THE METHOD

BACKGROUND OF THE INVENTION

The present invention relates to an AD conversion method and a system for converting analog signals into digital signals. The AD conversion method or the system according to the present invention can be effectively used, for example, in a digital waveform storage device or a digital storage oscilloscope.

In the conventional digital storage oscilloscopes and digital waveform storage devices as disclosed, for example, in Japanese Patent Application Laid-Open No. 59-37730, the input analog signals are converted into digital data through an AD converter (hereinafter referred to as ADC), the digital data is stored in a memory at a high speed, the stored data is retrieved from the memory into a microprocessor or a central processing unit where it is subjected to signal processing and display on the screen of a cathode-ray tube.

In this case, in general, a single ultra-high speed ADC is used.

According to the above prior art, the conversion operation is usually delayed when the input analog signal frequency $f_{in}$ and the sampling frequency $f_s$ exceed given values, and erroneous digital codes are produced. This phenomenon is called conversion error or a missing code.

The conversion error develops more frequently with the increase in the resolution of the ADC, at lower frequencies of input analog signals or of sampling signals.

In a 4-bit ADC, for example, a sampling frequency $f_s$ of 500 megasamples/sec. (Msps) is permitted. In an 8-bit ADC, however, a sampling frequency $f_s$ of only about 200 Msps is permitted.

As mentioned above, the conversion error imposes a limitation on the input signal frequency $f_{in}$ and on the sampling frequency $f_s$, making it difficult to carry out the AD conversion at high speeds.

SUMMARY OF THE INVENTION

The object of the present invention is to provide an AD conversion method and system capable of being used in high-frequency regions of input analog signals.

Another object of the present invention is to provide an AD conversion method and system which features high-speed operation yet maintaining high resolution.

The above-mentioned objects are achieved by the present invention which provides a method of converting analog signals into digital signals and a system for putting the method into practice, including supplying the same analog signal to first and second ADC's that convert a sample value of the analog signal into a digital signal consisting of n bits and a digital signal consisting of n bits (m and n are positive integers, and m>n), respectively, in order to obtain first digital data consisting of m bits and second digital data consisting of n bits for the same sample value of the analog signal. This is followed by deciding whether the difference between the value of the first digital data and the value of the second digital data is greater than a predetermined value or not; and outputting the first digital data as a digital signal for the analog signal when the difference is not greater than the predetermined value, and the second digital data as a digital signal for the analog signal when the difference is greater than the predetermined value.

DETAILED DESCRIPTION OF THE PREFERRED EMBODIMENTS

Embodiments of the invention shown in the accompanying drawings will now be described.

Figure 1:
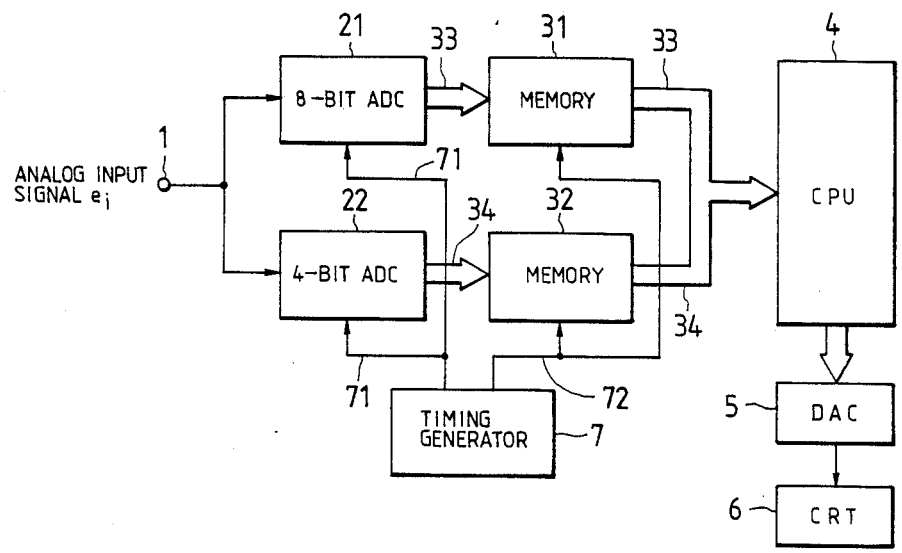
FIG. 1 is a block diagram of an AD conversion system according to a first embodiment of the present invention.
Figure 2:
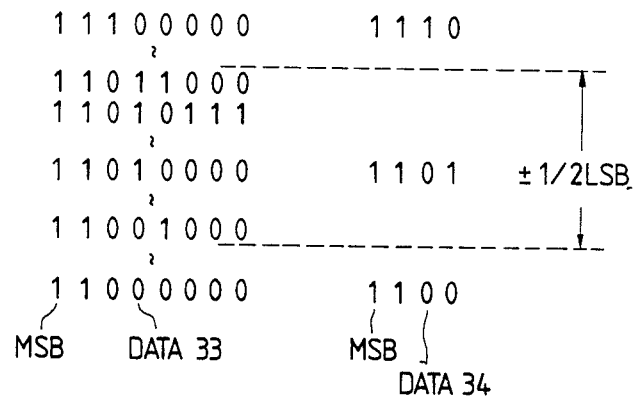
FIG. 2 is a diagram for explaining the operation of a central processing unit used in the embodiment of FIG. 1.

FIG. 1 is a block diagram of an AD conversion system according to a first embodiment of the present invention, and FIG. 2 is a diagram for explaining the operation of a central processing unit (hereinafter referred to as CPU) used in the first embodiment of the present invention.

As shown in FIG. 1, the AD conversion system of this embodiment comprises an 8-bit ADC 21, a 4-bit ADC 22, memories 31 and 32, a timing generator 7, a DA converter (hereinafter referred to as DAC) 5, a cathode-ray tube (hereinafter referred to as CRT) 6 and a CPU 4.

The 8-bit ADC 21 is a high accuracy, low speed unit, and the 4-bit ADC 22 is a low accuracy, high speed unit.

With the above-mentioned constitution, an analog input signal $e_i$ applied to a terminal 1 is further applied to both the high accuracy, low speed 8-bit ADC 21 and the low accuracy, high speed 4-bit ADC 22, simultaneously.

In response to sampling clock signals 71 formed by the timing generator 7, the ADC's 21 and 22 carry out AD conversion operations, simultaneously. The thus obtained digital data 33, 34 is written at high speeds into the memories 31 and 32 in response to clock signals 72.

Digital data 33 and 34 stored in the memories 31 and 32 is read at a low speed by the CPU 4 and is subjected to an operation. Depending upon the result of the operation, the CPU 4 output either one of the data 33 or 34. The output signal of the CPU 4 is converted into an analog signal via the DAC 5 and is displayed on the CRT 6 in the form of an input signal waveform.

The operation executed by the CPU 4 consists of comparing the data 33 and 34 that is read from the memories 31 and 32.

When the input signals $e_i$ have a low frequency or when the sampling clock signals 71 have a low frequency, the ADC 21 produces correct 8-bit data 33. As the frequency of the input signals $e_i$ or the sampling clock signals 71 increases, however, error increases in the 8-bit data 33, and the accuracy becomes lower than the 4-bit accuracy.

The 4-bit data 34 obtained from the ADC 22, on the other hand, is capable of maintaining 4-bit accuracy even when the input signals $e_i$ or the sampling clock signals 71 have a high frequency.

In this embodiment, the value of data 33 is used as a digital output signal when the value of data 33 lies within ±½ LSB of the value of data 34, and the value of data 34 is used in other cases.

In this embodiment, the aforementioned "LSB" designates the least significant bit of the 4-bit data 34 produced from the 4-bit ADC 22. The "LSB" further designates a quantity corresponding to the least significant bit of the 4-bit data 34. This quantity is equal to a quantity that corresponds to the fourth bit as counted from the most significant bit in the 8-bit data 33 produced from the 8-bit ADC 21. The input analog voltage that corresponds to the 1 LSB is a $\frac{1}{2}^4 \times$ full-scale value of the input voltage.

Concretely speaking the operation, as shown in FIG. 2, in the case that the value of data 34 is, for example, 1101 successively from the most significant bit (hereinafter referred to as MSB), the 8-bit data of data 33 is used as a digital output signal when the value of data 33 lies over a range of from 11011000 to 11001000 (±½ LSB of the data 34). When the value of data 33 lies in other ranges, the 4-bit data of data 34 is used as the digital output signal.

Weights of 8 bits of the data 33 are 8 LSB, 4 LSB, 2 LSB, 1 LSB, ½ LSB, ¼ LSB, ⅛ LSB and 1/16 LSB, successively from the MSB, and ½ LSB is used as a threshold value for whether 1 LSB stands or not.

That is, when the value of the data 34 is 1101, the input analog voltage is represented by 13 LSB. Similarly, when the value of the data 33 is 11011000, the input analog voltage is represented by 13½ LSB. When the value of the data 33 is 11010111, the input analog voltage is represented by 13 7/16 LSB. When 11010000, it is represented by 13 LSB. When 11001000, it is represented by 12½ LSB and when 11000000, it is represented by 12 LSB. In this case, values 11011000, 11010111, 11010000, and 11001000 of the data 33 lie within a range of 13±½ LSB relative to 13 LSB represented by 1101 of the data 34, and the value of high accuracy data 33 is used as a value of the digital output signal.

Figure 3:
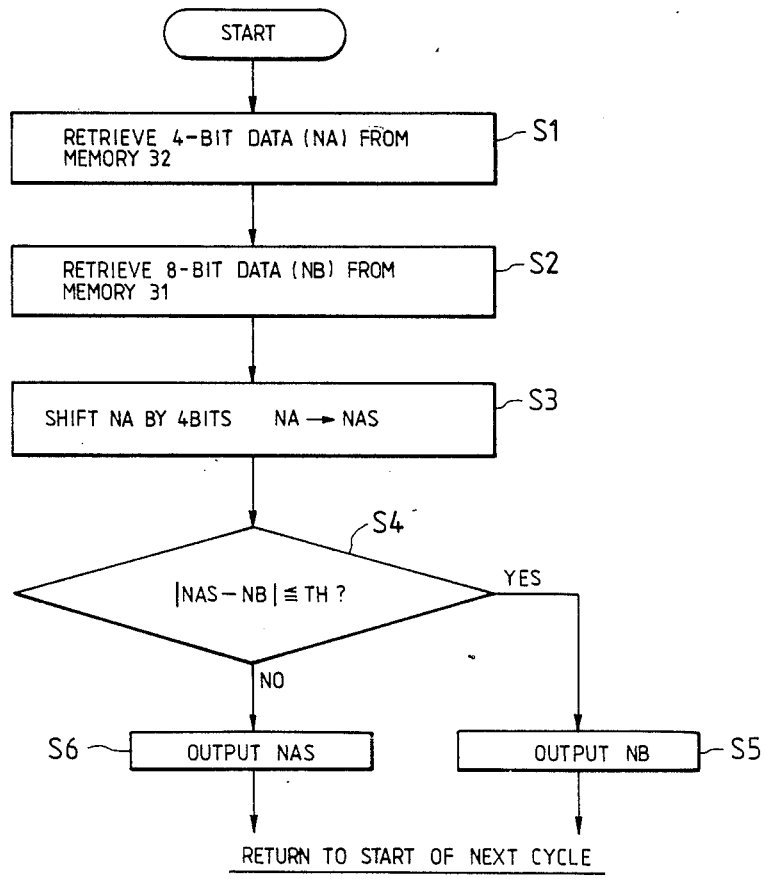
FIG. 3 is a flow chart illustrating the processing executed by the central processing unit used in the embodiment of FIG. 1.

FIG. 3 is a flow chart for explaining a cycle of processing executed by the CPU 4 used in the embodiment.

In a step S1, the CPU 4 retrieves 4-bit data NA from the memory 32.

In a step S2, the CPU 4 retrieves 8-bit data NB from the memory 31.

In a step S3, the 4-bit data NA is shifted by four bits. That is, the fifth to eighth bits 0000 are added to the data NA so that it becomes 8-bit data NAS.

In a step S4, it is determined whether the absolute value of the difference between the value of data NAS and the value of data NB is greater than a predetermined threshold value TH or not. In this embodiment as described above, TH=½ LSB.

When the absolute value of the difference is not greater than the threshold value TH, the program proceeds to a step S5 where the CPU 4 produces the data NB.

When the absolute value of the difference is in excess of the threshold value TH, the program proceeds to a step S6 where the CPU 4 produces the data NAS.

After the data NB or NAS is produced, the processing of the CPU 4 returns to the start of the next cycle.

As described above, the AD conversion can be carried out from low frequencies through high frequencies without developing any serious conversion error.

Figure 4:
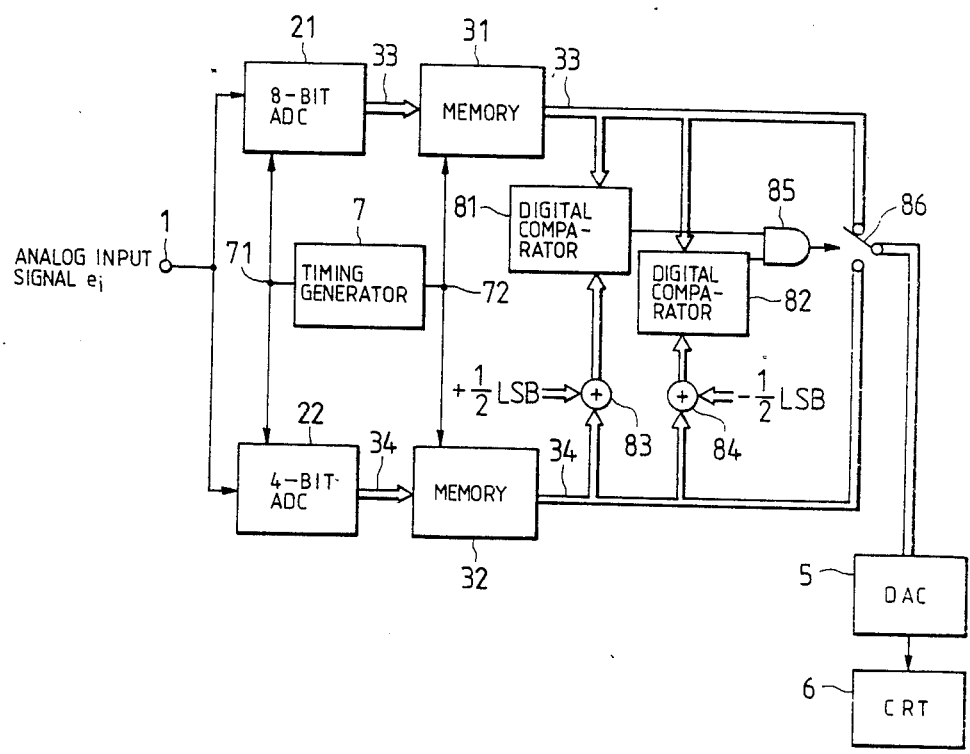
FIG. 4 is a block diagram of an AD conversion system according to a second embodiment of the present invention.

FIG. 4 is a block diagram of an AD conversion system according to a second embodiment of the present invention.

The AD conversion system of this embodiment comprises a DAC 5, a CRT 6, a timing generator 7, an 8-bit ADC 21, a 4-bit ADC 22, memories 31 and 32, digital comparators 81 and 82, adders 83 and 84, a logic circuit 85, and a digital switch 86.

In this embodiment, the operation of the CPU 4 employed in the first embodiment is carried out using specially designed hardware (comprising digital comparators 81 and 82, adders 83 and 84, logic circuit 85 and digital switch 86). By using the specially designed hardware, the operation can be carried out at high speed.

That is, +½ LSB and −½ LSB are added to the data 34 by the adders 83 and 84, and the resultant data is compared with the data 33 by the digital comparators 81 and 82.

When the data 33 lies within ±½ LSB of the data 34, the digital switch 86 is flipped to the side of the data 33 in response to an output from the logic circuit 85. When the data 33 lies outside the above range, the digital switch 86 is flipped to the side of the data 34.

That is, in this embodiment, the comparator 81 produces a pulse when the value of data 33 is not in excess of the output value of the adder 83 but does not produce pulse when the value of data 33 is in excess of the output value of the adder 83. The comparator 82, on the other hand, produces a pulse when the value of data 33 is not smaller than the output value of the adder 84 and produces no pulse when the value of data 33 is smaller than the output value of the adder 84. The logic circuit 85 is an AND circuit which sends an output pulse to the switch 86 only when the two input terminals thereof have received output pulses from comparators 81 and 82, simultaneously. The switch 86 stays at the side of the data 34 so long as no output is applied thereto from the AND circuit 85, and is flipped to the side of the data 33 only when it has received the output pulse from the AND circuit 85. Thus, when the value of data 33 lies within ±½ LSB of data 34, the data 33 is applied to the DAC 5. When the value of data 33 does not lie within the above range, the data 34 is applied to the DAC 5. In this case, the data 34 is shifted by four bits in the digital switch 86, i.e., the data 34 is imparted with fifth to eighth bits 0000, and is then applied to the DAC 5.

As described above, though the circuitry is more complex, the second embodiment is capable of operating at speeds faster than that of the first embodiment.

In the above-mentioned embodiments, ADC's having 8-bit and 4-bit resolutions were employed. However, the same effects can be obtained even when ADC's having different resolutions are employed.

Furthermore, although ±½ LSB was used as a threshold value of data, it is also allowable to use any value as a threshold value of data.

In the second embodiment, furthermore, it can be contrived to install the operation circuit constituted by hardware in the subsequent stage of the ADC's to send the output of the digital switch to the memory. In this case, the memory of one system is required contributing to simplifying the design.

Though two ADC's were used, it is also possible to use three or more ADC's such that the frequency ranges are covered by these ADC's.

Described below is the case where three ADC's of 4 bits, 6 bits and 8 bits are used. Generally, the input band of the ADC is lowered with the increase in the resolution, i.e., is lowered with the increase in the number of bits. As the frequency of input signals increases, therefore, the 8-bit ADC of high resolution develops the condition in which codes are missing, causing the accuracy to decrease. The ADC's used in this case have input bands that become high in the order of 8-bit, 6-bit and 4-bit ADC's.

Even when three ADC's are used, the AD conversion operations are carried out simultaneously in response to the same sampling clocks, and the obtained digital quantities are written into the memories. The written digital quantities are compared as described below, and which digital quantity is to be outputted is decided. Like those of FIGS. 1 and 4, the digital quantity is converted into an analog quantity via the DAC and is displayed on the CRT.

First, the method consists of comparing a digital quantity of the 4-bit ADC with a digital quantity of the 6-bit ADC. When a difference between these digital quantities does not lie within a given range, e.g., does not lie within $\pm\frac{1}{2}$ LSB ($\pm\frac{1}{2}^5$ full-scale) of 4-bit data, then the digital quantity of the 4-bit ADC is selected. When the above difference lies within the above range, a digital quantity of the 6-bit ADC is compared with a digital quantity of the 8-bit ADC. When this difference does not lie within a given range, e.g., does not lie within $\pm\frac{1}{2}$ LSB ($\pm\frac{1}{2}^7$ full-scale) of 6-bit data, then the digital quantity of the 6-bit ADC is selected and when the difference lies within the above range, the digital quantity of the 8-bit ADC is selected.

Thus, the digital quantities are successively compared starting from the ADC having low resolution, i.e., having low accuracy with those of ADC's having accuracies that are higher by one rank. When the difference is greater than, for example, $\pm\frac{1}{2}$ LSB of the ADC having lower accuracy, the digital quantity of the ADC of the lower accuracy is selected. When the difference lies within a given range, the digital quantity is compared with that of the ADC having accuracy that is higher by one rank. By repeating this operation, the method of the invention can be adapted to the cases where three or more ADC's are used.

The aforementioned methods of comparison can be effected by serially using circuitry similar to that of FIG. 1 or 4.

According to the present invention as described above, there are provided an AD conversion method and a system therefor that apparently operates at high speeds while maintaining high accuracy.

We claim:

1. A method of converting analog signals into digital signals, comprising the steps of:
   supplying an analog signal to first and second analog-to-digital converters to convert the analog signal into a first digital signal consisting of m bits and a second digital signal consisting of n bits, respectively, where m and n are positive integers, and m>n;
   determining whether the difference between the value of said first digital signal and the value of said second digital signal is greater than a predetermined value; and
   when said difference is not greater than said predetermined value, outputting said first digital signal, and when said difference is greater than said predetermined value, outputting said second digital signal.

2. A method of converting analog signals into digital signals according to claim 1, wherein said predetermined value is a value based on the least significant bit of said second digital signal.

3. A method of converting analog signals into digital signals according to claim 2, wherein said predetermined value is one-half the quantity that corresponds to the least significant bit of said second digital signal.

4. A method of converting analog signals into digital signals according to claim 1, wherein m=8 and n=4.

5. A method of converting analog signals into digital signals, comprising the steps of:
   supplying an analog signal to first, second and third analog-to-digital converters to convert the analog signal into, respectively, a first digital signal consisting of m bits, a second digital signal consisting of n bits, and a third digital signal consisting of p bits, where m, n and p are positive integers, and m>n>p;
   determining whether the difference between the value of said second digital signal and the value of said third digital signal is greater than a first predetermined value;
   when said difference between the value of said second digital signal and the value of said third digital signal is greater than said first predetermined value, outputting said third digital signal; and
   when said difference between the value of said second digital signal and the value of said third digital signal is not greater than said first predetermined value, determining whether the difference between the value of said first digital signal and the value of said second digital signal is greater than a second predetermined value, and when said difference between the value of said first digital signal and the value of said second digital signal is not greater than said second predetermined value, outputting said first digital signal, and when said difference between the value of said first digital signal and the value of said second digital signal is greater than said second predetermined value, outputting said second digital signal.

6. A method of converting analog signals into digital signals according to claim 5, wherein said first predetermined value is a value based upon the least significant bit of said third digital signal, and wherein said second predetermined value is a value based upon the least significant bit of said second digital signal.

7. A method of converting analog signals into digital signals according to claim 6, wherein said first predetermined value is one-half the quantity that corresponds to the least significant bit of said third digital signal, and said second predetermined value is one-half the quantity that corresponds to the least significant bit of said second digital signal.

8. A method of converting analog signals into digital signals according to claim 5, wherein m=8, n=6 and p=4.

9. An analog-to-digital conversion system comprising:
   first and second analog-to-digital converters for receiving a single analog signal to produce a first digital signal of m bits and a second digital signal of n bits, respectively, where m and n are positive integers, and m>n;
   means for determining whether the difference between the value of said first digital signal and the value of said second digital signal is greater than a predetermined value; and means responsive to said difference not being greater than said predetermined value for providing said first digital signal as an output signal and responsive to said difference being greater than said predetermined value for providing said second digital signal as an output signal.

10. An analog-to-digital conversion system according to claim 9, wherein said deciding means and said selecting means are constituted by a central processing unit.

11. An analog-to-digital conversion system according to claim 9, wherein said deciding means comprises:
   means for adding said predetermined value to the value of said second digital signal;
   means for subtracting said predetermined value from the value of said second digital signal;
   first comparing means for comparing the output of said adding means with the value of said first digital signal;
   second comparing means for comparing the output of said subtracting means with the value of said first digital signal; and
   logic circuit means for determining whether said difference is greater than said predetermined value based upon the outputs of said first and second comparing means;
   and wherein said selecting means comprises switching means for selecting one of said first digital signal and said second digital signal in response to the output of said logic circuit means.

12. An analog-to-digital conversion system according to claim 9, wherein said predetermined value is a value based upon the least significant bit of said second digital signal.

13. An analog-to-digital conversion system according to claim 12, wherein said predetermined value is one-half the quantity that corresponds to the least significant bit of said second digital signal.

14. An analog-to-digital conversion system according to claim 9, wherein $m=8$ and $n=4$.

* * * * *